US 6,615,164 B1

(12) United States Patent
Gopisetty et al.

(10) Patent No.: US 6,615,164 B1
(45) Date of Patent: Sep. 2, 2003

(54) METHOD AND APPARATUS FOR REPRESENTING INTEGRATED CIRCUIT DEVICE CHARACTERISTICS USING POLYNOMIAL EQUATIONS

(75) Inventors: Runip Gopisetty, Los Altos, CA (US); Gao Feng Wang, Sunnyvale, CA (US)

(73) Assignee: Synopsys Inc., Mountain View, CA (US)

( * ) Notice: Subject to any disclaimer, the term of this patent is extended or adjusted under 35 U.S.C. 154(b) by 0 days.

(21) Appl. No.: 09/293,560

(22) Filed: Apr. 15, 1999

(51) Int. Cl.[7] .............................................. G06F 7/60
(52) U.S. Cl. .......................... 703/2; 703/14; 703/18; 716/14; 700/53
(58) Field of Search ........................ 703/2, 18, 14; 702/60; 716/14; 700/53; 382/254

(56) References Cited

U.S. PATENT DOCUMENTS

| | | | | |
|---|---|---|---|---|
| 4,973,111 A | * | 11/1990 | Haacke et al. | 324/309 |
| 5,399,229 A | * | 3/1995 | Stefani et al. | 488/37 |
| 5,680,304 A | * | 10/1997 | Wang et al. | 700/53 |
| 5,775,089 A | * | 7/1998 | Skarvan | |
| 5,889,857 A | * | 3/1999 | Boudy et al. | 379/406.14 |
| 5,940,779 A | * | 8/1999 | Gaitonde et al. | 702/60 |
| 5,974,189 A | * | 10/1999 | Nicponski | 382/254 |
| 6,128,417 A | * | 10/2000 | Ausbeck, Jr. | 382/288 |
| 6,149,609 A | * | 11/2000 | Lieberman et al. | 600/587 |
| 6,289,734 B1 | * | 9/2001 | Daugela | 73/573 |
| 6,295,635 B1 | * | 9/2001 | Dhaene et al. | 716/14 |
| 6,374,084 B1 | * | 4/2002 | Fok | 455/67.4 |

OTHER PUBLICATIONS

Liu, Z.S., "QR methods of O(N) complexity in adaptive Parameter estimation", IEEE transactions on Signal Processing, Mar. 1995.*

* cited by examiner

Primary Examiner—Samuel Broda
Assistant Examiner—Kandasamy Thangavelu
(74) Attorney, Agent, or Firm—Bever, Hoffman & Harms, LLP; Jeanette S. Harms

(57) ABSTRACT

An approach for representing integrated circuit device characteristics using polynomial equations involves analyzing integrated circuit device characterization data in a lookup table form and using an order incremental scheme to determine a polynomial equation of a relatively low-order that satisfies specified accuracy criteria. In situations where a polynomial equation that has an order less than a maximum allowable order cannot be determined, the integrated circuit device characterization data is partitioned into sub-domains and polynomial equations are determined separately for each sub-domain. The separate polynomial equations are then combined to generate a piecewise polynomial equation that represents all of the integrated circuit device characterization data.

35 Claims, 7 Drawing Sheets

METHOD AND APPARATUS FOR REPRESENTING INTEGRATED CIRCUIT DEVICE CHARACTERISTICS USING POLYNOMIAL EQUATIONS

RELATED APPLICATION

The present application is related to U.S. patent application Ser. No. 09/990,298, entitled "System and Method for Using Scaleable Polynomials to Translate a Look-up Table Delay Model into a Memory Efficient Model," filed on Jan. 30, 1998.

FIELD OF THE INVENTION

The invention relates generally to integrated circuit design, and more specifically, to an approach for representing integrated circuit device characteristics using polynomial equations.

BACKGROUND OF THE INVENTION

As a result of the increased size and complexity of integrated circuits and economic pressures to reduce design cycle times, most contemporary integrated circuits are designed using electronic design automation (EDA) tools. EDA tools are available for almost every phase of the integrated circuit design process, for example logic testing, layout, simulation and test, verification and package design and test.

EDA tools that are used to predict and/or verify the performance of an integrated circuit design need to understand the characteristics of particular integrated circuit devices and cells contained in the design. That is, how the particular integrated circuit devices and cells contained in the design behave under various operating conditions for particular process technologies. Currently, two ways by which EDA tools understand the timing and power characteristics of integrated circuit devices are the multidimensional table approach and the empirical equation approach.

According to the multidimensional table approach, integrated circuit device characteristics are determined by simulating or measuring the performance of devices and cells under various operating parameters and environmental conditions using a circuit simulator such as HSPICE. The results are then stored in a set of multidimensional data tables that are organized in a library for use by EDA tools.

Multidimensional tables typically contain data that is based upon various timing parameters such as propagation delays, transition time delays and timing constraints including setup, hold, pulse width and recovery time, as measured against a number of factors (independent variables) that influence timing and power. Example factors include input transition time, output capacitance load, output resistance load, output inductance load, temperature, voltage and process type.

For example, two-dimensional tables are commonly used to characterize combinational elements, where the independent variables are input transition time and output load. Three-dimensional time tables are commonly used to characterize unbuffered sequential elements, where the independent variables are clock transition time, data transition time and output load. A set of sampling points are selected on the multidimensional independent variable domain. Device performance, e.g., timing, is characterized at each of the sampling points using a circuit simulator or by collecting actual measurement data. The characterization data is then stored in a data table in a semiconductor library for use by an EDA tool. When an EDA tool needs to determining the timing for a particular device, the EDA tool uses the multidimensional tables for the particular device to lookup a particular timing value. The EDA tool may also use either linear or polynomial interpolation to determine timing values between sampling points.

The use of multidimensional data tables generally provides a relatively high level of accuracy since actual (or interpolated) data values are used by the EDA tool. However, the data table approach also has disadvantages. The primary disadvantage of the data table approach is that large multidimensional tables require a large amount of storage space and also require a large amount of system resources and time to retrieve, for example, when an EDA tool retrieves large multidimensional tables over a network.

There are two primary factors that contribute to the large size of the multidimensional data tables. First, accurate modeling of device behavior in the non-linear operational domain generally requires a large number of sampling points to provide the necessary sampling granularity. For example, while a typical application-specific integrated circuit library may contain between five and ten sampling points per dimension, resulting in a two-dimensional table containing (25) to (100) data points. A table for modeling non-linear behavior may contain (400) data points.

Second, contemporary deep sub-micron designs are typically characterized with more operational and environmental parameters and therefore require an increasing number of dimensions. For example, temperature and voltage are increasingly important in system-on-chip designs where different regions of a chip are operate at different temperatures and voltages, causing the table size to grow quadratically.

Table compaction techniques have been proposed to reduce the size of multidimensional data tables in linear operating regions by removing over-sampled data points. However, these techniques are generally not practical in non-linear operating regions because of the need for higher sampling granularity when the rate of change on the surface is high. See "A fast and accurate technique to optimize characterization tables for logic synthesis," by J. F. Croix and D. F. Wong, Proceedings of 1997 Design Automation Conference, pp.337–340, Anaheim Convention Center, Anaheim, Calif., Jun. 9–13, 1997.

According to the empirical equation approach, a set of empirical equations is developed for an integrated circuit device from a simplified device model that define the operation of the device over a broad range of operating parameters and operating conditions. The empirical equations are often derived by hand and rely upon many assumptions about the operational behavior of a device.

The primary drawback of using empirical equations is that they are not sufficiently accurate for many applications. Contemporary semiconductor devices are very sophisticated and their operation can be affected by a large number of operational conditions and environmental factors. Empirical equations make many assumptions about operational conditions and environmental factors when the equations are developed. Therefore it is very hard to determine an accurate initial empirical equation. Even when such an equation exists, the number of terms in the equation can be very large (between 20 and 30), leading to computational complexity. As a result, empirical equations often do not accurately model integrated circuit device behavior when these parameters change.

Accordingly, based upon the need to represent integrated circuit device characteristics for use in integrated circuit analysis and the limitations in prior approaches, an approach for representing integrated circuit device characteristics that avoids the limitations of the prior approaches is highly desirable.

SUMMARY OF THE INVENTION

This and other needs are met by embodiments of the invention, which in one aspect provide a method for representing one or more characteristics of an integrated circuit device. According to the method, integrated circuit device characterization data is received that indicates one or more characteristics of the integrated circuit device. Then a polynomial equation representation of the integrated circuit device characterization data is determined based upon the integrated circuit device characterization data, wherein the polynomial equation representation satisfies specified accuracy criteria.

According to another aspect of the invention, a computer system is provided for representing one or more characteristics of an integrated circuit device. The computer system comprises a storage medium containing integrated circuit device characterization data and a polynomial equation generation mechanism communicatively coupled to the storage medium. The polynomial equation generation mechanism is configured to determine a polynomial equation representation of the integrated circuit device characterization data based upon the integrated circuit device characterization data, wherein the polynomial equation representation satisfies specified accuracy criteria.

Other aspects and advantages of the invention will become apparent from the following description and claims.

BRIEF DESCRIPTION OF THE DRAWINGS

Embodiments of the invention are illustrated by way of example, and not by way of limitation, in the figures of the accompanying drawings and in which like reference numerals refer to similar elements and in which.

DETAILED DESCRIPTION OF THE INVENTION

Figure 1:
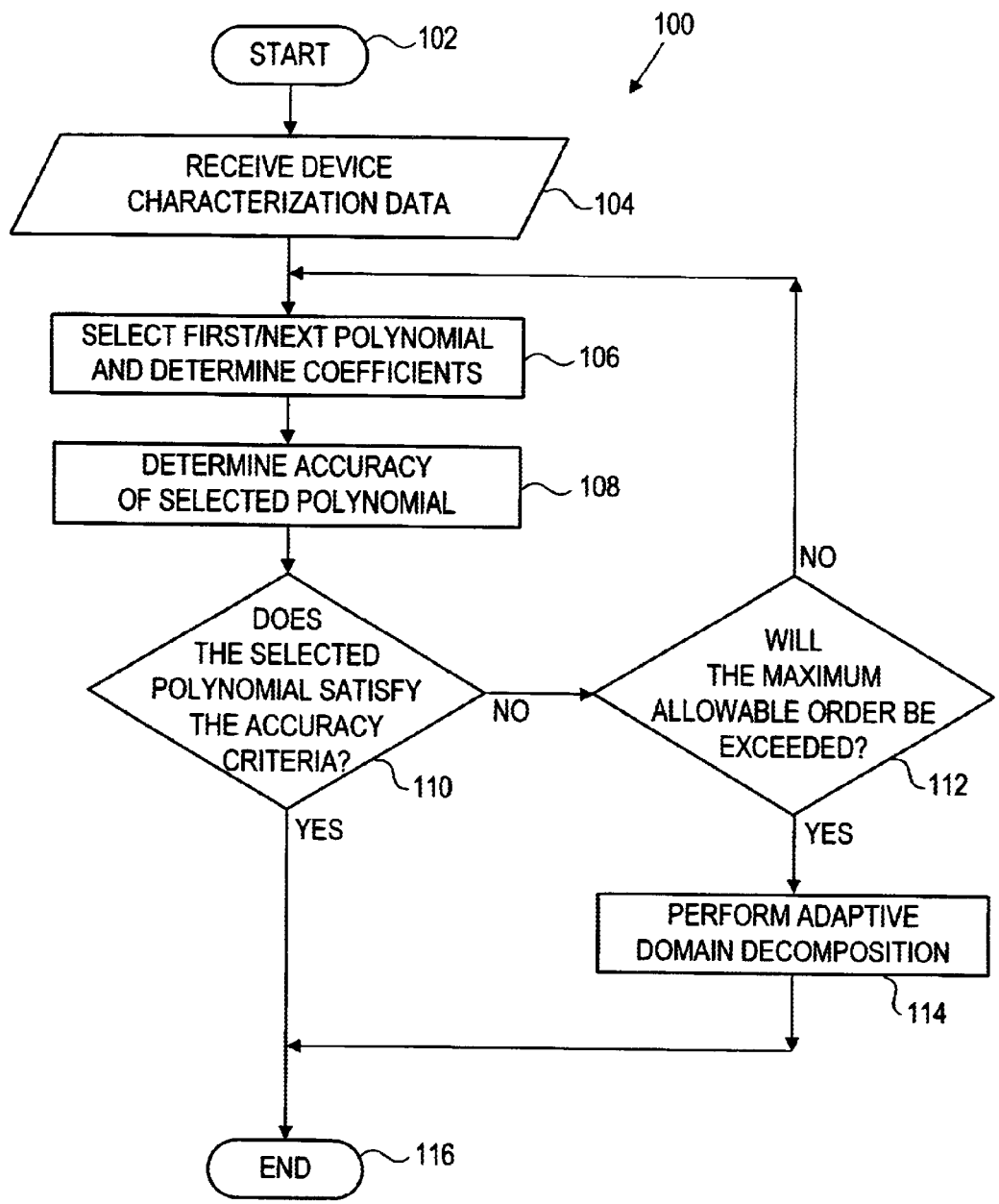
FIG. 1 is a level flow chart illustrating an approach for representing integrated circuit device characteristics using polynomial equations according to an embodiment of the invention.

In the following description, for the purposes of explanation, specific details are set forth in order to provide a thorough understanding of the invention. However, it will be apparent that the invention may be practiced without these specific details. In other instances, well-known structures and devices are depicted in block diagram form in order to avoid unnecessarily obscuring the invention.

Overview

An approach is provided for accurately representing integrated circuit device characteristics using polynomial equations. In general, polynomial equations are determined from device characterization data using a least squares problem approach. The least squares problem is solved using various techniques such as QR decomposition with column pivoting, Householder transforms and basis function scaling and matrix balancing, that are each described in more detail hereinafter. The approach is applicable to both linear and non-linear devices, with linear devices generally being represented by relatively lower-order polynomial equations and non-linear devices generally being represented by relatively higher-order polynomial equations. As used herein, the "order" of a polynomial equation refers to the number of terms in the polynomial equation. As used herein, a "term" of a polynomial equation refers to a polynomial basis function as defined hereinafter. When expressed in sum of products form, the terms of a polynomial are also those elements that are separated from each other by plus, i.e. "+", and minus, i.e. "−", signs.

One of the fundamental tenets of the approach for representing integrated circuit device characteristics using polynomial equations is that lower-order polynomial equations are generally preferred over relatively higher-order polynomial equations to reduce the amount of computational resources and time that are required to use the polynomial equations, so long as the polynomial equations provide an accurate representations of the device simulation data. According to one embodiment of the invention, an iterative polynomial equation selection approach, referred to herein as an order incremental scheme, is used to select one or more relatively low-order polynomial equations that provide a sufficiently accurate representation of the device simulation data.

According to the order incremental scheme, a relatively low-order polynomial equation, for example a polynomial equation with one or two terms, is used as the first trial functional form of polynomial. A set of optimal coefficients are determined for the polynomial equation by solving the least square problem as described in more detail hereinafter. A determination is made whether the selected polynomial equation satisfies specified error criteria. If the selected polynomial equation does not satisfy the specified error criteria, then a higher-order polynomial equation is selected, solved and tested against the specified error criteria. Each successively higher-order polynomial equation has more basis functions and thus more degrees of freedom than the prior lower-order polynomial equation and is likely to yield a more accurate, albeit a more complex, solution. Thus, the finally-selected polynomial equation generally is the lowest-order polynomial equation that satisfies the specified error criteria.

The general approach for accurately representing integrated circuit device characteristics using polynomial equations is described with reference to a flow chart 100 of FIG. 1 After starting in step 102, in step 104, device characterization data is retrieved. The device characterization data may include any type of device characterization data and typically includes data that specifies device performance under a variety of operating parameters and environmental conditions. The device characterization data may be received from a variety of locations, depending upon the particular implementation. For example, the device characterization data may be a multidimensional data table received from a data file stored on non-volatile storage, received from a remote location via a network or other communication link, or received directly from an integrated circuit simulation mechanism.

In step 106, a first, generally lower-order polynomial equation is selected and coefficients are determined for the selected polynomial equation using the least square problem approach describe in more detail hereinafter.

In step 108, the accuracy of the selected polynomial equation is determined. The accuracy of the selected polynomial equation depends upon how accurately the original device characterization data can be re-created using the selected polynomial equation.

In step 110, a determination is made whether the selected polynomial equation satisfies the specified accuracy criteria. For example, a worst case error between values generated using the selected polynomial equation and the device characterization data may be compared to a specified error threshold to determine whether the selected polynomial equation satisfies the specified accuracy criteria. If, in step 110, a determination is made that the selected polynomial equation does not satisfy the specified accuracy criteria, then a higher-order polynomial equation, having a larger number of terms, is used to represent the device characterization data. Higher-order polynomial equations have more basis functions and more degrees of freedom and therefore tend to provide a more accurate representation of the device characterization data.

Before control returns to step 106 where the next (higher-order) polynomial equation is selected, in step 112 a determination is made whether the order of the next (higher-order) polynomial equation will exceed a maximum allowable order specified by polynomial complexity criteria. For example, the polynomial complexity criteria may specify that the final polynomial equation must be of tenth order or lower, to reduce the amount of system resources and time that are required to calculate values from the final polynomial equation. If the order of the next (higher-order) polynomial equation will not exceed the maximum allowable order, then control returns to the step 106 where the next (higher-order) polynomial equation is selected.

If in step 112, a determination is made that the final order of the next (higher-order) polynomial equation will exceed the maximum allowable order, then in step 114, a technique referred to herein as "adaptive domain decomposition" is employed to determine a piecewise polynomial equation to represent the device characterization data. Adaptive domain decomposition is described in more detail hereinafter. The process is complete in step 116.

The approach for accurately representing integrated circuit device characteristics using polynomial equations described herein provides a more accurate representation of device behavior than empirical equation approaches since the polynomial equations are determined directly from device characterization data, thus avoiding the oversimplifications and assumptions characteristic of the empirical equation approaches. Furthermore, the present approach requires significantly fewer system resources than conventional data table approaches since large amounts of table data are represented with relatively fewer polynomial equations that require less storage space and can be easily provided to an EDA tool over a network.

Various aspects and features of the invention are now described in more detail hereinafter. Specifically, step 106 of FIG. 1 is described in more detail in the following sections: (1) least square formulations; (2) QR decomposition with column pivoting; (3) QR decomposition via Householder transforms; and (4) basis function scaling and matrix balancing. Step 108 is described in more detail in sections (1) and (2). Step 114 is described in more detail in section (5) adaptive domain decomposition. Finally, other aspects and features of the invention are described in sections (6) processing examples; and (7) implementation mechanisms. For purposes of explanation, embodiments of the invention are described in the context of device characterization data in the form of timing and power tables. However, embodiments of the invention are applicable to any type of device characterization data.

1. Least Square Formulations

According to one embodiment of the invention, determining polynomial equations to represent device characterization data is mathematically formulated as a least square problem. Given a d-dimensional timing or power data table of size n as follows:

$$\{x_1^{(1)}, x_2^{(1)}, \ldots, x_d^{(1)}, z^{(1)}\}, \{x_1^{(2)}, x_2^{(2)}, \ldots, x_d^{(2)}, z^{(2)}\}, \ldots, \{x_1^{(n)}, x_2^{(n)}, \ldots, x_d^{(n)}, z^{(n)}\} \quad (EQ\ 1)$$

where the timing or power data at each sampling point is denoted within a pair of brackets, in which the first d components (each shown as "x" with a subscript) represent the values of each independent variable whereas the last component "z" denotes the timing or power value.

The objective is to find an optimal polynomial equation $P_k(x_1, x_2, \ldots, x_d)$ of k terms:

$$P_k(x_1, x_2, \ldots, x_d) = \sum_{j=1}^{k} c_j \cdot b_j(x_1, x_2, \ldots, x_d) \quad (EQ\ 2)$$

such as $$\min_{\{c_i\}} \sum_{i=1}^{n} [z^{(i)} - P_k(x_1^{(i)}, x_2^{(i)}, \ldots, x_d^{(i)})]^2 \quad (EQ\ 3)$$

where $b_j(x_1, x_2, \ldots, x_d) = (x_1)^{n_{j1}} \cdot (x_2)^{n_{j2}} \cdot \ldots \cdot (x_d)^{n_{jd}}$ (j=1, 2, …, k and $n_{j1}, n_{j2}, \ldots n_{jd}$ are non-negative integers) are the polynomial basis functions, and $c_j$ (j=1, 2, …, k) are the unknown coefficients to be determined by solving the minimization problem, i.e., the above least square problem.

The values of polynomial equations $P_k(x_1, x_2, \ldots, x_d)$ at the sampling points can be expressed in terms of the unknown coefficients $c_j$ (j=1, 2, …, k):

$$P_k(x_1^{(i)}, x_2^{(i)}, \ldots, x_d^{(i)}) = \sum_{j=1}^{k} c_j \cdot b_j(x_1^{(i)}, x_2^{(i)}, \ldots, x_d^{(i)}) \quad (EQ\ 4)$$

for i=1, 2, …, n. In matrix form, one obtains $$p = A\xi \quad (EQ\ 5)$$

where A is an n-by-k matrix, p is a vector of size n and $\xi$ is a vector of size k. The elements of the matrix and vectors are given by $$A_{ij} = b_j(x_1^{(i)}, x_2^{(i)}, \ldots, x_d^{(i)})$$

$$p_i = P_k(x_1^{(i)}, x_2^{(i)}, \ldots, x_d^{(i)})$$

$$\xi_j = c_j \quad (EQ\ 6)$$

where i=1, 2, …, n and j=1, 2, …, k.

By introducing a vector $$z = [z^{(1)} z^{(2)} \ldots z^{(n)}]^t \quad (EQ\ 7)$$

where the superscript t denotes the transpose of a matrix or vector, the above minimization problem can be written in the matrix form as:

$$\min_{\{c_j\}} \|z - p\|_2^2 = \min_{\xi} \|z - A\xi\|_2^2 \quad (EQ\ 8)$$

where $\|\circ\|_2$ denotes the Euclidean norm (or 2-norm) of a vector.

Once the minimization problem (EQ 8) has been solved, the residual of the least squares gives the mean relative error between the actual timing or power values and the estimated values of the optimized polynomial equation on grids. The mean relative error is given by $$E_{mean} = \frac{\|z - A\xi_{opt}\|_2}{\|z\|_2} \quad (EQ\ 9)$$

where $\xi_{opt}$ denotes the solution of the minimization problem (EQ 8). Moreover, more strict error criterion is defined by the infinity norm, i.e., $$E_\infty = \|\Delta z\|_\infty = \max_{1 \le i \le n} |(\Delta z)_i| \quad (EQ\ 10)$$

where $(\Delta z)_i = (z - A\xi_{opt})_i/(z)_i$ if $(z)_i \ne 0$ and $(\Delta z)_i = (z - A\xi_{opt})_i$ if $(z)_i = 0$, and $(z - A\xi_{opt})_i$ and $(z)_i$ denote the i-th components of the vectors $z - A\xi_{opt}$ and $z$, respectively. The infinity norm definition provides a measure of the maximum relative error between the actual timing or power values contained in the device characterization data and values generated from the optimized polynomial equations. Therefore, the determined accuracy of a selected polynomial equation in step 108 can be defined by EQ 9 or EQ 10.

In situations when the number of basis functions in the polynomial equation is much smaller than the table size, i.e., k<<n, the matrix A is not a square matrix. Rather, the matrix A has more rows than columns. In this situation, the matrix equation $A\xi = z$ is an over-determined system.

According to one embodiment of the invention, when the matrix A is not a square matrix, QR decomposition with column pivoting is used to to solve the least square problem of (EQ 8).

2. QR Decomposition With Column Pivoting

In general QR decomposition with column pivoting involves decomposing a non-square matrix into two matrices, an orthogonal matrix and a triangular matrix. QR decomposition with column pivoting is described in "Unitary triangularization of a nonsymmetric matrix," by A. S. Householder, *Journal of the ACM*, vol.5, pp.339–342, 1958, which is herein incorporated by reference.

Continuing with the previous example, assume that $A \in R^{n \times k}$ has rank $r \le k << n$. The QR decomposition with column pivoting gives $$A\Pi = QR \quad (EQ\ 11)$$

where $Q \in R^{n \times n}$ is an orthogonal matrix, $\Pi \in R^{k \times k}$ is a permutation matrix, and $R \in R^{n \times k}$ is an upper triangular matrix as $$R = \begin{bmatrix} R_{11} & R_{12} \\ 0 & 0 \end{bmatrix} \quad (EQ\ 12)$$

where $R_{11} \in R^{r \times r}$ is an upper triangular matrix and $R_{12} \in R^{r \times (k-r)}$.

Note that the Euclidean length of a vector is invariant under orthogonal transforms. The orthogonal matrix Q and the permutation matrix $\Pi$ have no impact on the Euclidean norm. Making use of the QR decomposition (EQ 11), the following equation is obtained:

$$\|z - A\xi\|_2^2 = \|z - QR\Pi^t\xi\|_2^2 = \|Q^t z - R\Pi^t\xi\|_2^2 \quad (EQ\ 13)$$

By writing $$\Pi^t \xi = \begin{bmatrix} \xi_1 \\ \xi_2 \end{bmatrix} \quad \text{and} \quad Q^t z = \begin{bmatrix} z_1 \\ z_2 \end{bmatrix} \quad (EQ\ 14)$$

with $$\xi_1 \in R^r,\ \xi_2 \in R^{k-r},\ z_1 \in R^r,\ \text{and}\ z_2 \in R^{n-r},$$

(EQ 13) leads to $$\|z - A\xi\|_2^2 = \|z_1 - R_{12}\xi_2 - R_{11}\xi_1\|_2^2 + \|z_2\|_2^2 \quad (EQ\ 15)$$

Therefore, the solution $\xi$ of the minimization problem (EQ 8) must satisfy $$\xi_1 = R_{11}^{-1}(z_1 - R_{12}\xi_2) \quad (EQ\ 16)$$

For any $\xi_2$, the vector $$\xi_{opt} = \Pi \begin{bmatrix} R_{11}^{-1}(z_1 - R_{12}\xi_2) \\ \xi_2 \end{bmatrix} \quad (EQ\ 17)$$

solves the minimization problem (EQ 8). For simplicity, $\xi_2$ is set to zero, yielding the basic solution:

$$\xi_{opt} = \Pi \begin{bmatrix} R_{11}^{-1} z_1 \\ 0 \end{bmatrix} \quad (EQ\ 18)$$

The error criteria are obtained as:

$$E_{mean} = \frac{\|z_2\|_2}{\|z\|_2} \quad (EQ\ 19)$$

$$E_\infty = \max_{1 \le i \le n} |(\Delta z)_i| \quad (EQ\ 20)$$

Therefore, the determined accuracy of a selected polynomial equation in step 108 can be defined by EQ 19 or EQ 20.

3. QR Decomposition Via Householder Transforms

According to one embodiment of the invention, QR decomposition is performed using Householder transforms. Householder transforms are well suited for QR decomposition because they provide a robust and efficient scheme for performing QR decomposition, particularly for dense or "full" matrices. In general, using Householder transforms causes elements in the lower triangular portion of matrix A to be zeroed using a sequence of orthogonal matrices, called Householder matrices. One important benefit of orthogonal transformation is that amplification of round-off errors is controlled during numerical computations.

This approach does not require that Householder matrices be explicitly generated. Instead, the Householder matrices are implicitly implemented using matrix-vector multiplications. An explanation of this approach is described in *Matrix Computations*, by G. H. Golub and C. F. Van Loan, The Johns Hopkins University Press, Baltimore, Md., 3rd Edition, 1996, which is herein incorporated by reference.

As previously described herein, the matrix A is the discrete operator representation of the basis functional space over the independent variable domain of the original data. In general, the matrix A has full rank, i.e., r=min (k, n)=k, and conventional QR factorization works well. In some situations, the matrix A may be rank deficient, i.e., r<k, due to either an innate property of original data or numerical round-off errors. Therefore, according to an embodiment of the invention, in situations where the matrix A is rank deficient, QR factorization with column pivoting is used instead of conventional QR factorization.

According to another embodiment of the invention, for situations where matrix A is a "sparse" matrix, Lanczos vectors are used to perform QR decomposition. Techniques for performing statistical decomposition of matrices using Lanczos algorithms are well known and need not be described in detail herein.

4. Basis Function Scaling and Matrix Balancing

In some situations particular basis functions have much larger values than other basis finctions at certain data points $\{(x_1^{(i)}, x_2^{(i)}, \ldots, x_d^{(i)})\}$ over the independent variable domain. This phenomenon is attributable to the characteristic that basis functions in a polynomial equation consist of products of powers of independent variables. For example, the basis functions $b_1(x_1, x_2, x_3) = x_1$ and $b_2(x_1, x_2, X_3) = x_1^2 \cdot x_2 \cdot x_3$ have the values of $10^2$ and $10^8$, respectively, at point (100, 100, 100), resulting in a $10^6$ difference in magnitude. Thus, there can be significant disparities between element magnitudes in the matrix A, which can cause significant computational round-off errors to be introduced into a solution due to computational limitations in a particular computing platform.

According to one embodiment of the invention, basis functions are scaled to balance the matrix A and reduce the difference in magnitude of values between basis functions. A set of nonzero scalars is introduced $d_1, d_2, \ldots, d_k$ to scale the basis functions $\{b_j(x_1, x_2, \ldots, x_d)\}$ as follows:

$$A\xi = (AD^{-1})(D\xi) = \begin{bmatrix} a_{11}d_1^{-1} & a_{12}d_2^{-1} & \cdots & a_{1k}d_k^{-1} \\ a_{21}d_1^{-1} & a_{22}d_2^{-1} & \cdots & a_{2k}d_k^{-1} \\ \vdots & \vdots & \ddots & \vdots \\ a_{n1}d_1^{-1} & a_{n2}d_2^{-1} & \cdots & a_{nk}d_k^{-1} \end{bmatrix} \begin{bmatrix} d_1\xi_1 \\ d_2\xi_2 \\ \vdots \\ d_k\xi_k \end{bmatrix} = \tilde{A}\tilde{\xi} \quad \text{(EQ 21)}$$

where $D = \text{diag}\{d_1, d_2, \ldots, d_k\}$, $\tilde{A} = AD^{-1}$, and $\tilde{\xi} = D\xi$.

This scaling approach is equivalent to using the scaled basis functions $\{b_j(x_1, x_2, \ldots, x_d)/d_j\}$ in the place of the original basis finctions. Once the new set of coefficients $\tilde{\xi}$ is known, the original set of coefficients are given by $\xi = D^{-1}\tilde{\xi}$. The scalars $d_1, d_2, \ldots, d_k$ are then selected so that the Euclidean norms of each column vectors of the matrix A are equal. The determination of whether basis function scaling is to be applied depends upon the requirements of a particular application. According to one embodiment of the invention, the norm of the columns in matrix A are compared to determine the relative magnitude of the values contained in the columns. If the relative magnitudes exceed a specified threshold, then basis finction scaling is applied.

5. Adaptive Domain Decomposition

In some situations, device characterization data contains abrupt changes in values that are difficult to represent with a single polynomial equation. In general, an abrupt change is any type of significant change in data values, such as a "spike" or "ridge". Abrupt changes are typically caused by a corresponding abrupt change in device operation. For example, as the environmental temperature at which a particular device is operated exceeds a specified threshold, the operation of the particular device may change suddenly. According to an embodiment of the invention, a technique referred to herein as adaptive domain decomposition is used to represent device characterization data using a piecewise polynomial equation.

Adaptive domain decomposition generally involves partitioning a device characterization data domain into separate sub-domains until there are no rapid changes in the surface and the sub-domains can be accurately modeled by a single polynomial equation of sufficiently low-order. According to the approach, a sufficiently accurate polynomial equation is first determined for the top-level device characterization domain using the techniques described herein. Then, the order of the polynomial equation is compared to polynomial complexity criteria (maximum allowable order) to determine whether the top-level device characterization domain needs to be partitioned. Assuming that the top-level device characterization domain needs to be partitioned, partition boundaries are established by determining the rate of change of device characterization data over the top-level device characterization domain and then establishing lines or planes at locations where the data shows the most drastic changes. According to one embodiment of the invention, break points are inserted at the locations where the rate of change of the device characterization data exceeds a specified domain threshold.

Once the top-level device characterization domain has been partitioned into sub-domains, the process of determining polynomial equations described herein is repeated recursively for each sub-domain. For example, suppose that a particular top level device characterization domain is partitioned into two sub-domains. Starting with the first sub-domain, a particular polynomial equation is determined for the first sub-domain and evaluated against the accuracy criteria and polynomial complexity criteria. If the particular polynomial equation satisfies both the accuracy criteria and the polynomial complexity criteria, then the first sub-domain is completed and the second sub-domain is processed. If, however, the particular polynomial equation satisfies the accuracy criteria but not the polynomial complexity criteria, then the first sub-domain is partitioned into sub-domains that are processed separately. Thus, domain decomposition stops at a particular sub-domain when a single optimal polynomial equation is determined for the particular sub-domain that satisfies both the accuracy criteria and the polynomial complexity criteria. Domains and sub-domains may be partitioned into any number of sub-domains, depending upon the characteristics of domain and sub-domain data.

After a polynomial equation has been determined for each sub-domain, the polynomial equations are combined into a piecewise polynomial equation. The piecewise polynomial equation specifies the portion of the device characterization domain over which each polynomial equation is valid. Thus, the piecewise polynomial equation represents the entire domain and satisfies the accuracy criteria. An example of determining a piecewise polynomial equation using adaptive domain decomposition is provided hereinafter in Example 2.

6. Processing Examples

This section contains several examples of the approach described herein for representing integrated circuit device characteristics using polynomial equations.

EXAMPLE 1

In the first example, a polynomial equation is determined for a three-dimensional data table of size (1000) that is generated over a characterization domain $[0,10] \times [0,15] \times [0,7.5]$ as follows:

$$x_1^{(i)} = j_1 \ (j_1 = 0,1,2,\ldots,9)$$

$$x_2^{(i)} = 1.5 j_2 \ (j_2 = 0,1,2,\ldots,9)$$

$$x_3^{(i)} = 0.75 j_3 \ (j_3 = 0,1,2,\ldots,9)$$

$$z^{(i)} = 1 + 6x_1^{(i)} + 7x_2^{(i)} + 9x_3^{(i)} + 3x_1^{(i)}x_2^{(i)} + 4x_1^{(i)}x_3^{(i)} + 2x_2^{(i)}x_3^{(i)} + x_1^{(i)}x_2^{(i)}x_3^{(i)} \quad (EQ\ 22)$$

where $i = 100 j_1 + 10 j_2 + j_3 + 1$. For this example, the specified accuracy criteria is a relative error of $10^{-6}$. Thus, the accuracy criteria is satisfied if the maximum relative error between the data values in the data table and data values generated by the resulting polynomial equation is smaller than or equal to $10^{-6}$. In addition, the maximum allowable polynomial equation order is ten. This means that if the three-dimensional data table cannot be represented by a single polynomial equation of order ten or less, then adaptive domain decomposition will be used to determine a piecewise polynomial equation to represent the three-dimensional data table.

which results in a mean relative error $E_{mean} = 0.236349$ and a maximum relative error $E_\infty = 402.469$. Since again the specified accuracy criteria is not satisfied, a higher-order pollynomical is required.

At the fourth iteration, a polynomial equation with eight terms is determined to represent the three-dimensional data table as $$P_{8opt}(x_1,x_2,x_3) = 1 + 6x_1 + 7x_2 + 9x_3 + 3x_1x_2 + 4x_1x_3 + 2x_2x_3 + x_1x_2x_3 \quad (EQ\ 24)$$

which results in a mean relative error $E_{mean} = 0$ and a maximum relative error $E_\infty = 0$. The specified accuracy criteria is satisfied by this polynomial equation and the order of the polynomial equation, namely eight, is less than the maximum allowed order of ten. Therefore, the eighth-order polynomial equation of EQ24 can be used to represent the three-dimensional data table. It should be noted that the three-dimensional data table can be fully recovered by the eight-order polynomial equation of EQ24 since both the mean relative error and maximum relative error are zero.

EXAMPLE 2

In the second example, the capability of representing abrupt changes in data values in a data table is demonstrated using the adaptive domain decomposition approach according to an embodiment of the invention. Specifically, a piecewise polynomial equation is determined for a two-dimensional data table of size (900) that contains abrupt data changes. The data table is generated over a characterization domain $[0,15] \times [0,22.5]$ as follows:

TABLE I

| Iteration | Order of Polynomial | The Resulting Optimal Polynomial with the Given Order | $E_{mean}$ | $E_\infty$ |
|---|---|---|---|---|
| 1 | 1 basis | 405.578 | 0.622368 | 404.578 |
| 2 | 4 bases | $-401.469 + 62.5312x_1 + 42.4375x_2 + 70.875x_3$ | 0.236349 | 402.469 |
| 3 | 7 bases | $103.516 - 16.7812x_1 - 8.1875x_2 - 21.375x_3 + 6.375x_1x_2 + 10.75x_1x_3 + 6.5x_2x_3$ | 0.051447 | 102.516 |
| 4 | 8 bases | $1 + 6x_1 + 7x_2 + 9x_3 + 3x_1x_2 + 4x_1x_3 + 2x_2x_3 + x_1x_2x_3$ | 0 | 0 |

Table I shows polynomial equations of various orders for the three-dimensional data table determined in accordance with an embodiment of the invention. Although none of the polynomial equations contained in Table I contain terms with a power greater than one, embodiments of the invention are applicable to polynomial equations containing terms of any power. At the first iteration, a polynomial equation having one term is used to model the three-dimensional data table. The polynomial equation having one term that best represents the three-dimensional data table is found to be $P_{1opt}(x_1,x_2,x_3) = 405.578$, which results in a mean relative error $E_{mean} = 0.622368$ and a maximum relative error $E_\infty = 404.578$. Since the accuracy criteria, i.e., the maximum relative error below $10^{-6}$, is not satisfied by the polynomial equation with one term, a relatively higher-order polynomial equation is required.

At the second iteration, a polynomial equation with four terms is determined to represent the three-dimensional data table. The polynomial equation with four terms that best represents the three-dimensional data table is determined to be $$P_{4opt}(x_1,x_2,x_3) = -401.469 + 62.5312x_1 + 42.4375x_2 + 70.875x_3 \quad (EQ\ 23)$$

$$x_1^{(i)} = 0.5 j_1 \ (j_1 = 0,1,2,\ldots,29)$$

$$x_2^{(i)} = 0.75 j_2 \ (j_2 = 0,1,2,\ldots,29)$$

$$z^{(i)} = P(x_1^{(i)}, x_2^{(i)}) \quad (EQ\ 25)$$

where $i = 30 j_1 + j_2 + 1$ and $$P(x_1,x_2) = \begin{cases} 3 + 5x_1 + 4x_2 + 3x_1x_2 & \text{if } x_1 < 10 \\ 1 - 2x_1 + 3x_2 + x_1x_2 & \text{if } x_1 \geq 10 \text{ and } x_2 < 10 \\ 30 + 5x_1 + 3x_2 + 4x_1x_2 & \text{otherwise} \end{cases} \quad (EQ\ 26)$$

For the second example, suppose the specified maximum allowable order is six. Since the specified accuracy criteria cannot be satisfied by a single-piece polynomial equation having an order of six or less, adaptive domain decomposition is used to determine a piecewise polynomial equation.

Figure 2:
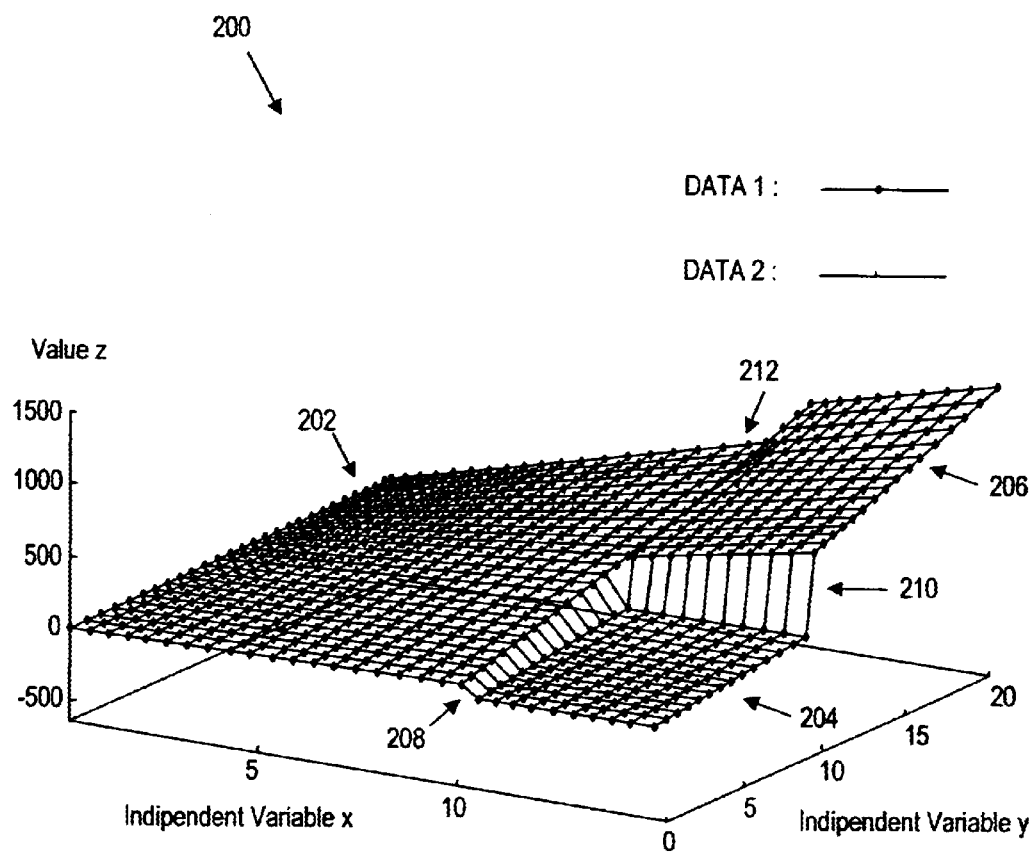
FIG. 2 is a graph illustrating the an approach for representing integrated circuit device characteristics using piecewise polynomial equations determined by adaptive decomposition according to an embodiment of the invention.

FIG. 2 illustrates both data from the two-dimensional data table (DATA 1), represented by larger triangular symbols, and data computed from the piecewise polynomial equation (DATA2), represented by relatively smaller dot symbols, determined according to the adaptive domain decomposition approach of the present invention. In some situations, for example if a non-piecewise polynomial equation was used to represent the two-dimensional data table, large discrepancies would be visually apparent between data from the two-dimensional data table and data generated from the non-piecewise polynomial equations. However, as illustrated by FIG. 2, data calculated from the piecewise polynomial equation (DATA 2), determined in accordance with the invention, very closely matches the original data from the two-dimensional data table (DATA 1). According to an application of adaptive domain decomposition to the present example, characterization domain 200 is divided into three sub-domains 202 ([0,10]×[0,22.5]), 204 ([10,15]×[0,10]), and 206 ([10,15]×[10,22.5]).

Sometimes special attention must be given to the interfaces between sub-domains when a domain is partitioned. In the present example, the interface regions are generally indicated in FIG. 2 by reference numerals 208, 210 and 212. According to one embodiment of the invention, interface regions 208, 210 and 212 are analyzed as separate sub-domains and separate polynomial equations are determined for each interface region 208, 210 and 212. Interface regions can often be represented by relatively lower-order polynomial equations, for example polynomial equations having two or three terms, but sometimes require piecewise polynomial equations because of abrupt changes in data values contained in the interface regions.

EXAMPLE 3

Embodiments of the invention are now described and illustrated with reference to FIGS. 3–6 in the context of representing inverter simulation data using polynomial equations. In Example 3, an inverter is characterized using an accurate circuit level simulator. The inverter has an input pin A and an output pin Y. Timing characterization data is retrieved from the simulator and stored as four timing data tables including two delay tables and two transition time tables. Each data table is a two-dimensional table that contains (400) data points with (20) sampling points along each of the independent variables. The two independent variables are input transition time and output capacitance load.

Figure 3:
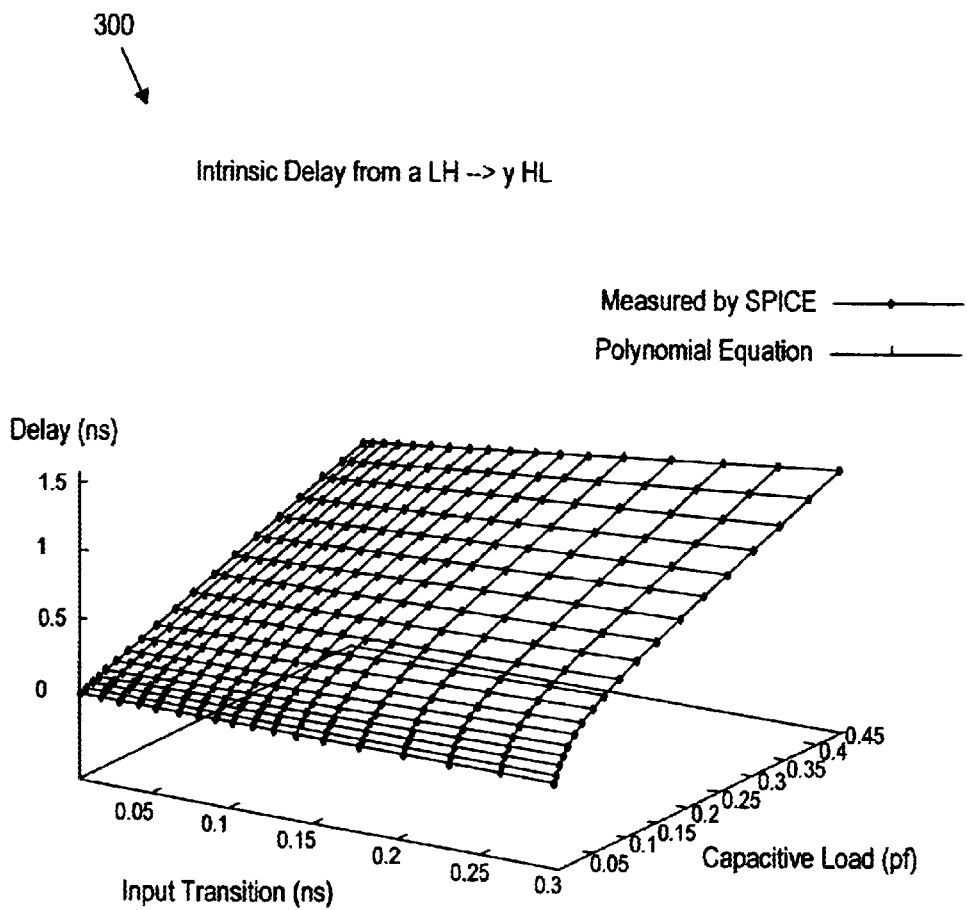
FIGS. 3 and 4 are graphs illustrating a representation of integrated circuit device timing delay characteristics using polynomial equations according to an embodiment of the invention.
Figure 4:
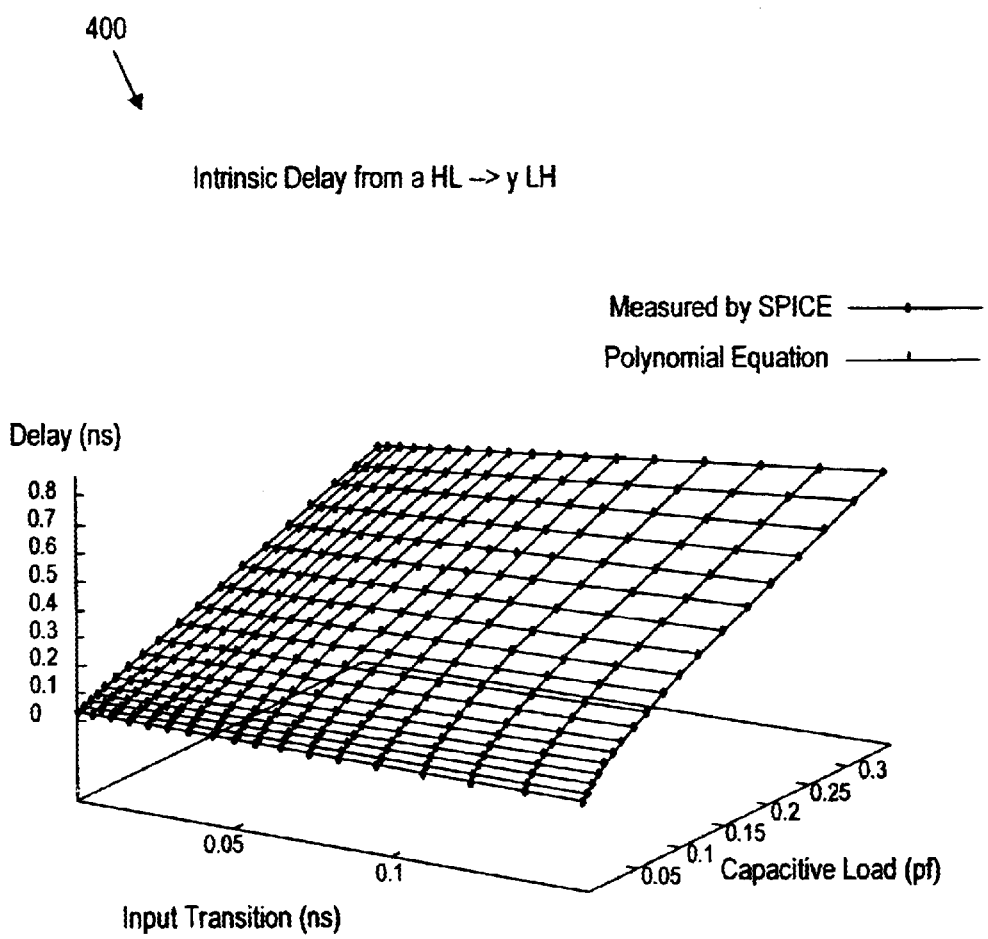
Figure 5:
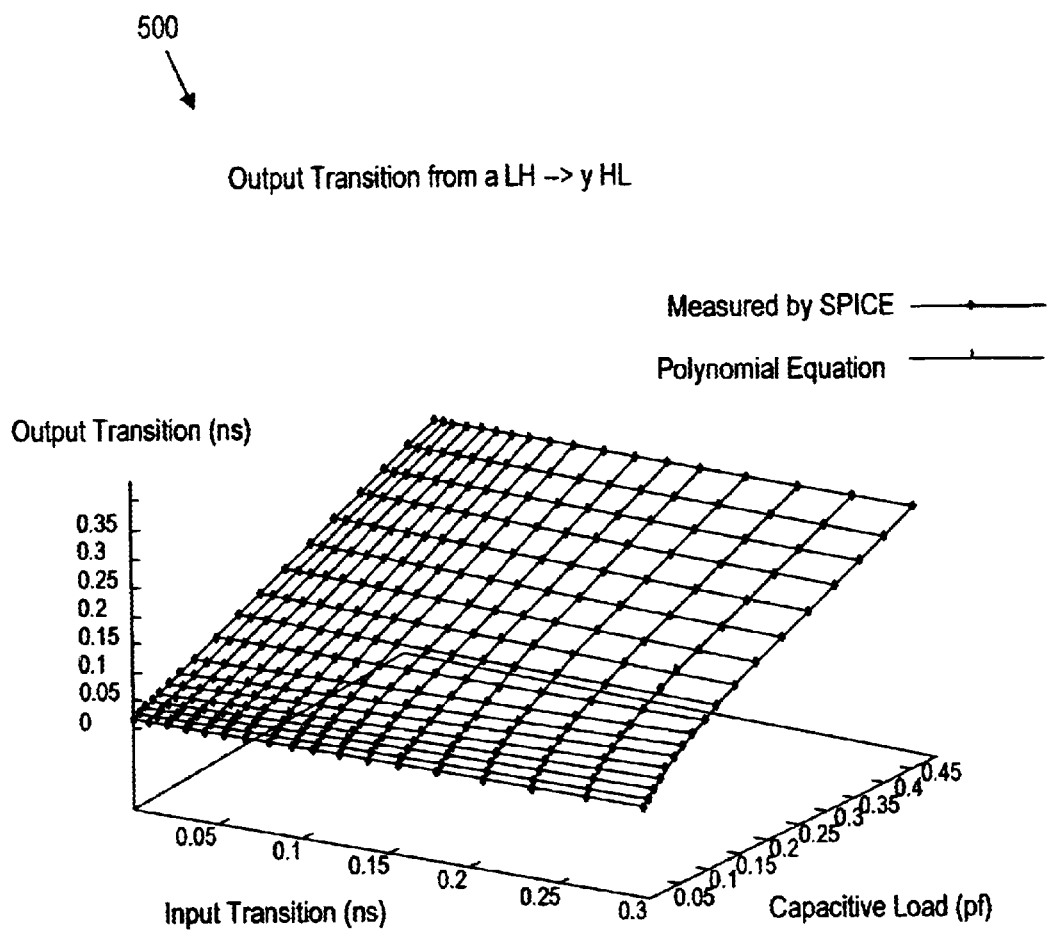
FIGS. 5 and 6 are graphs illustrating a representation of integrated circuit device transition time characteristics using polynomial equations according to an embodiment of the invention.
Figure 6:
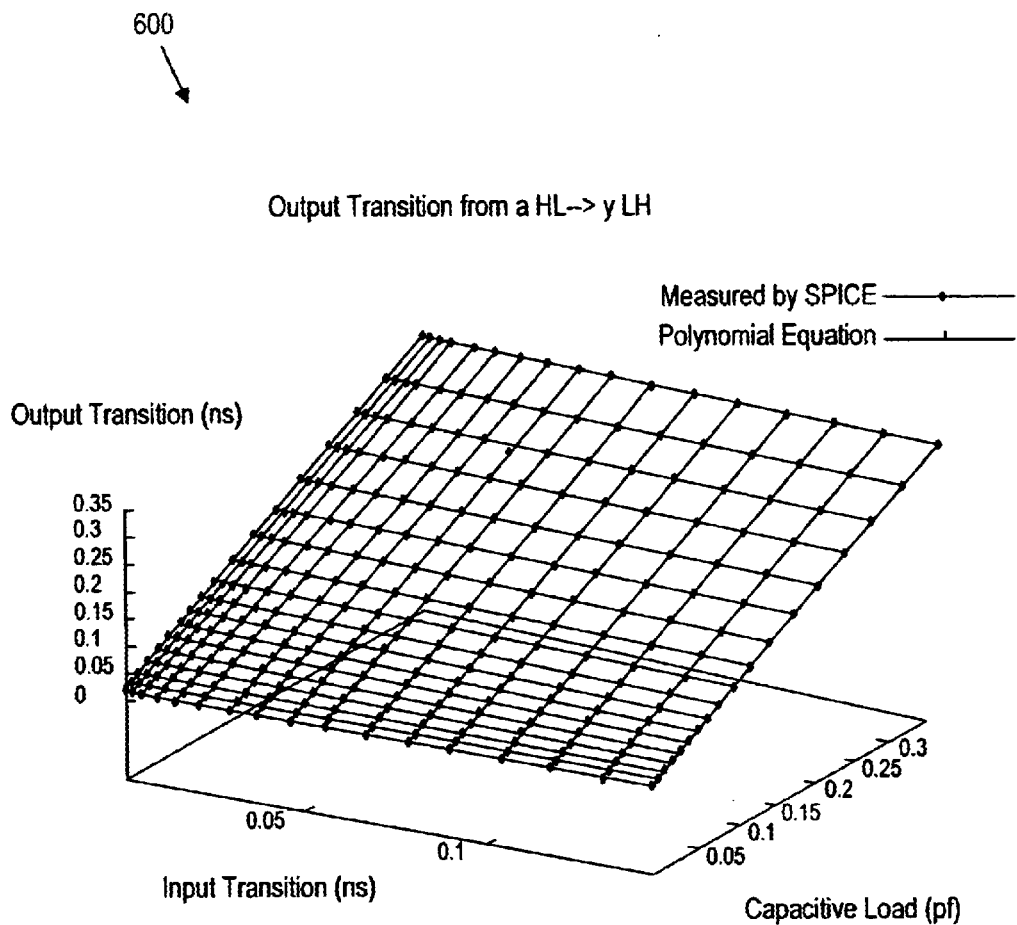

FIG. 3 is a graph 300 that illustrates the timing delay from input A to output Y in response to a rising input signal (LH) applied to input A. FIG. 4 is a graph 400 that illustrates the timing delay from input A to output Y in response to a falling input signal (HL) applied to input A. FIG. 5 is a graph 500 that illustrates the transition times of output Y falling from a logic HIGH to a logic LOW in response to an input stimulus rising from a logic LOW to a logic HIGH. FIG. 6 is a graph 600 that illustrates the transition times of output Y rising from a logic LOW to a logic HIGH in response to an input stimulus on input A falling from a logic HIGH to a logic LOW.

Each graph 300, 400, 500 and 600 illustrates both the simulated data "measured by SPICE" as indicated by the larger triangular symbols, and data calculated from a corresponding polynomial equation "polynomial equation" as indicated by the relatively smaller dot symbols and determined for the simulated data using the approach described herein. In each graph 300, 400, 500 and 600, the simulated data "measured by SPICE" and the data calculated from the corresponding polynomial equation "polynomial equation" are nearly coextensive, indicating that the polynomial equations represent the simulation data very accurately. Although the data tables generated by the simulator each contain (400) data points, the corresponding polynomial equations determined using the approach described herein are relatively simple and require much less storage space.

The polynomial equations determined using the approach described herein for Example 3 are illustrated in hereinafter in TABLE II in the context of an example Delay and Power Calculation Language (DPCL) implementation. DPCL is being added to the IEEE standard. See IEEE P1481, "Standard for Delay and Power Calculation System," IEEE Standards Department, 1998, which is incorporated herein by reference in its entirety for all purposes. Note that equation (1), that corresponds to the graph 300 of FIG. 3 is a piecewise polynomial equation.

TABLE II

```
CALC(calc_equation_0):
    passed(real: a1, a2)
    result(real: 0.0320895+0.481278*a1+1.729*a2+1.67829*a1*a2);
CALC(calc_equation_1):
    passed(real: a1, a2)
    result(
        when(0.0061259 <= a2)
            result(real: 0.025108+0.928471*a1+1.8643*a2+2.37908*a1*a2-1.41492*a1*a1-
0.686517*a2*a2
        ),
        otherwise result(
            when(0.0024699 <= a2 && a2 <= 0.0061261)
                result(real: 0.0392948+0.472932*a1+2.07111*a2+12.6796*a1*a2-0.83541*a1*a1
            ),
            otherwise result(
                when(0.0005549 <= a2 && a2 <= 0.0024701)
                    result(real: 0.0397869+0.44705*a1+2.1906*a2+14.045*a1*a2-0.753893*a1*a1
                ),
                otherwise result(real:
                    /*when(a2 <= 0.0005551)*/
                    0.0401251+0.435832*a1+2.26675*a2+14.6541*a1*a2-0.714491*a1*a1
                )
            )
        )
    )
);
CALC(calc_equation_2):
    passed(real: a1, a2)
    result(real: 0.0104416+0.120515*a1+0.838978*a2);
CALC(calc_equation_3):
```

TABLE II-continued

```
   passed(real: a1, a2)
   result(real: 0.00715177+0.134785*a1+0.599409*a2);
delay(delay_model_0):
   when(SOURCE_EDGE == 'F' && SINK_EDGE == 'R')
      early(calc_equation_0(EARLY_SLEW, loadCap(TO_POINT).cap))
      late(early),
   otherwise
   /*when(SOURCE_EDGE == 'R' && SINK_EDGE == 'F')*/
      early(calc_equation_1(EARLY_SLEW, loadCap(TO_POINT).cap))
      late(early);
slew(slew_model_0):
   when(SOURCE_EDGE == 'F' && SINK_EDGE == 'R')
      early(calc_equation_2(EARLY_SLEW, loadCap(TO_POINT).cap))
      late(early),
   otherwise
   /*when(SOURCE_EDGE == 'R' && SINK_EDGE == 'F')*/
      early(calc_equation_3(EARLY_SLEW, loadCap(TO_POINT).cap))
      late(early);
```

7. Implementation Mechanisms

The approach for representing device characteristics using polynomial equations described herein may be implemented in hardware circuitry, in computer software or a combination of hardware circuitry and computer software. For example, the approach may be implemented as a stand-alone program used to convert multidimensional data tables into a polynomial equation library. Polynomial equations may then be read from the library by an EDA tool and used (interpreted) by the EDA tool to perform an analysis. As another example, the approach may be directly integrated into an EDA tool and used to convert multidimensional data tables into a polynomial equation library. As yet another example, instead of the polynomial equations being interpreted by an EDA tool, the approach described herein may be implemented in DPCL to provide polynomial equations in object code form. Polynomial equations in object code form provide additional savings in computational resources required to use the polynomial equations.

Figure 7:
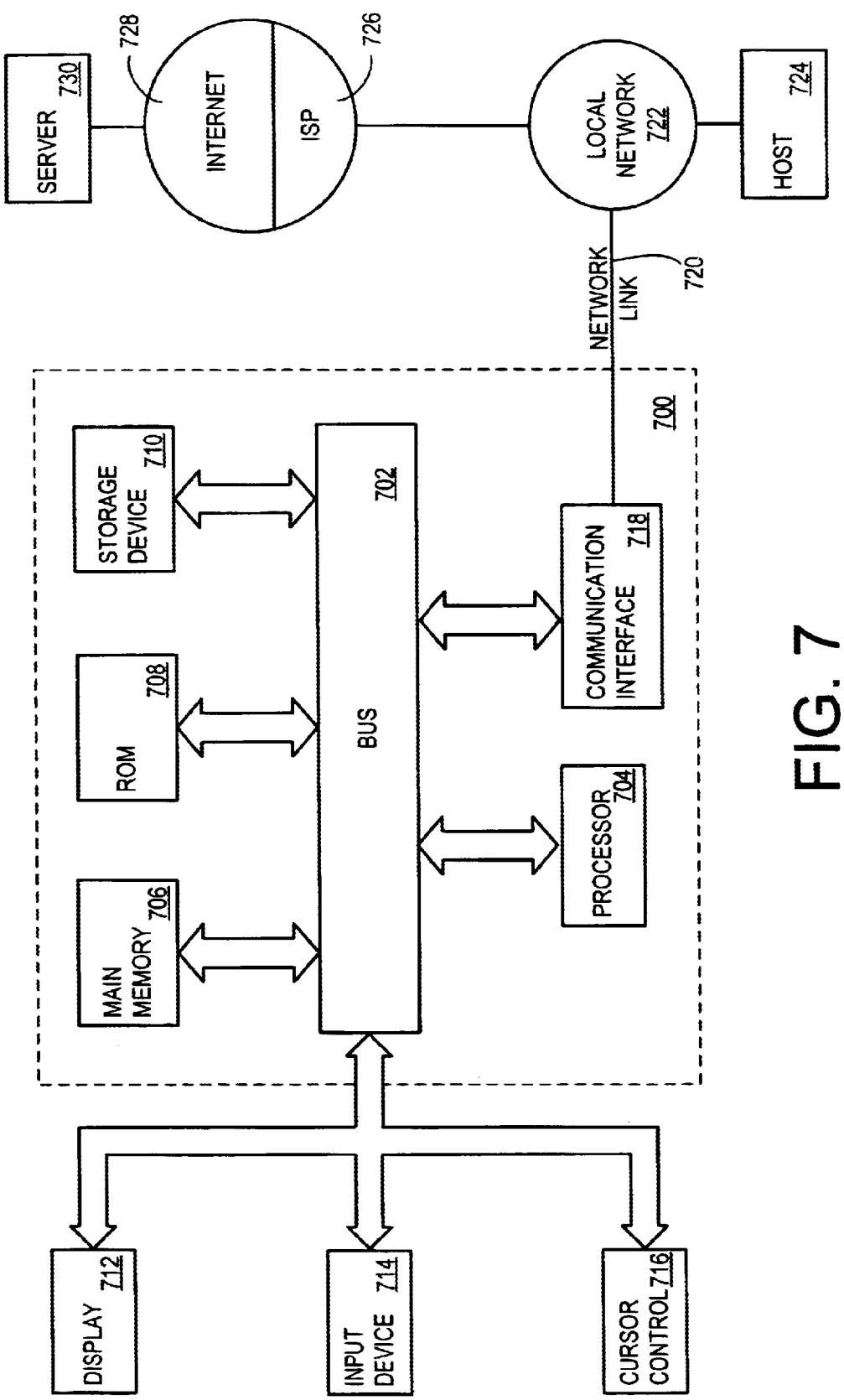
FIG. 7 is a block diagram on which embodiments of the invention may be implemented.

FIG. 7 is a block diagram that illustrates a computer system 700 upon which an embodiment of the invention may be implemented. Computer system 700 includes a bus 702 or other communication mechanism for communicating information, and a processor 704 coupled with bus 702 for processing information. Computer system 700 also includes a main memory 706, such as a random access memory (RAM) or other dynamic storage device, coupled to bus 702 for storing information and instructions to be executed by processor 704. Main memory 706 also may be used for storing temporary variables or other intermediate information during execution of instructions to be executed by processor 704. Computer system 700 further includes a read only memory (ROM) 708 or other static storage device coupled to bus 702 for storing static information and instructions for processor 704. A storage device 710, such as a magnetic disk or optical disk, is provided and coupled to bus 702 for storing information and instructions.

Computer system 700 may be coupled via bus 702 to a display 712, such as a cathode ray tube (CRT), for displaying information to a computer user. An input device 714, including alphanumeric and other keys, is coupled to bus 702 for communicating information and command selections to processor 704. Another type of user input device is cursor control 716, such as a mouse, a trackball, or cursor direction keys for communicating direction information and command selections to processor 704 and for controlling cursor movement on display 712. This input device typically has two degrees of freedom in two axes, a first axis (e.g., x) and a second axis (e.g., y), that allows the device to specify positions in a plane.

The invention is related to the use of computer system 700 for representing integrated circuit device characteristics using polynomial equations. According to one embodiment of the invention, the representation of integrated circuit device characteristics using polynomial equations is provided by computer system 700 in response to processor 704 executing one or more sequences of one or more instructions contained in main memory 706. Such instructions may be read into main memory 706 from another computer-readable medium, such as storage device 710. Execution of the sequences of instructions contained in main memory 706 causes processor 704 to perform the process steps described herein. One or more processors in a multi-processing arrangement may also be employed to execute the sequences of instructions contained in main memory 706. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 704 for execution. Such a medium may take many forms, including but not limited to, non-volatile media, volatile media, and transmission media. Non-volatile media includes, for example, optical or magnetic disks, such as storage device 710. Volatile media includes dynamic memory, such as main memory 706. Transmission media includes coaxial cables, copper wire and fiber optics, including the wires that comprise bus 702. Transmission media can also take the form of acoustic or light waves, such as those generated during radio wave and infrared data communications.

Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 704 for execution. For example, the instructions may initially be carried on a magnetic disk of a remote computer. The remote computer can load the instructions into its dynamic memory and send the instructions over a telephone line using a modem. A modem local to computer system 700 can receive the data on the telephone line and use an infrared transmitter to convert the data to an infrared signal. An infrared detector coupled to bus 702 can receive the data carried in the infrared signal and place the data on bus 702. Bus 702 carries the data to main memory 706, from which processor 704 retrieves and executes the instructions. The instructions received by main memory 706 may optionally be stored on storage device 710 either before or after execution by processor 704.

Computer system 700 also includes a communication interface 718 coupled to bus 702. Communication interface 718 provides a two-way data communication coupling to a network link 720 that is connected to a local network 722. For example, communication interface 718 may be an integrated services digital network (ISDN) card or a modem to provide a data communication connection to a corresponding type of telephone line. As another example, communication interface 718 may be a local area network (LAN) card to provide a data communication connection to a compatible LAN. Wireless links may also be implemented. In any such implementation, communication interface 718 sends and receives electrical, electromagnetic or optical signals that carry digital data streams representing various types of information.

Network link 720 typically provides data communication through one or more networks to other data devices. For example, network link 720 may provide a connection through local network 722 to a host computer 724 or to data equipment operated by an Internet Service Provider (ISP) 726. ISP 726 in turn provides data communication services through the world wide packet data communication network now commonly referred to as the "Internet" 728. Local network 722 and Internet 728 both use electrical, electromagnetic or optical signals that carry digital data streams. The signals through the various networks and the signals on network link 720 and through communication interface 718, which carry the digital data to and from computer system 700, are exemplary forms of carrier waves transporting the information.

Computer system 700 can send messages and receive data, including program code, through the network(s), network link 720 and communication interface 718. In the Internet example, a server 730 might transmit a requested code for an application program through Internet 728, ISP 726, local network 722 and communication interface 718. In accordance with the invention, one such downloaded application provides for representing integrated circuit device characteristics using polynomial equations as described herein.

The received code may be executed by processor 704 as it is received, and/or stored in storage device 710, or other non-volatile storage for later execution. In this manner, computer system 700 may obtain application code in the form of a carrier wave.

The approach described herein for representing integrated circuit device characteristics using polynomial equations provides several advantages over prior approaches. First, the polynomial equations require relatively less storage space than the data tables from which the polynomial equations are determined. As a result, the polynomial equations can be provided to an EDA tool more quickly than the data tables from which the polynomial equations are determined. This allows the equations to be efficiently transferred to an EDA tool over a communication link such as a network.

Second, the polynomial equations are determined based upon integrated circuit device characterization data according to specified error criteria and therefore provide a more accurate solution than comparable empirical equations that are determined using over-simplified models and numerous assumptions.

Finally, the polynomial equations offer a flexible solution that may be implemented as a stand-alone tool or integrated into and EDA tool. Furthermore, the polynomial equations may be interpreted by an EDA tool or implemented in DPCL or other compiled languages to provide more favorable performance.

Having fully described a preferred embodiment of the invention and various alternatives, those skilled in the art will recognize, given the teachings herein, that numerous alternatives and equivalence exist which do not depart from the invention. It is therefore intended that the invention not be limited by the foregoing description, but only by the appended claims.

What is claimed is:

1. A method for representing one or more characteristics of an integrated circuit device, the method comprising the computer-implemented steps of:

receiving integrated circuit device characterization data that indicates one or more characteristics of the integrated circuit device;

determining a polynomial equation representation of the integrated circuit device characterization data using a least squares algorithm;

determining whether the polynomial equation representation satisfies a specified accuracy criteria;

determining whether a next higher order polynomial equation representation exceeds a maximum allowable order, when the polynomial equation representation does not satisfy the specified accuracy criteria; and determining a piecewise polynomial equation representation based upon the integrated circuit device characterization data, that satisfies the specified accuracy criteria, when the maximum allowable order is exceeded, wherein the step of determining a piecewise polynomial equation representation comprises;

determining rates of change of data values contained in the integrated circuit device characterization data;

logically partitioning the integrated circuit device characterization data into two or more portions based upon the determined rates of change of data values;

determining, for each of the two or more portions, a separate polynomial equation representation of the integrated circuit characterization data contained in the respective portion, wherein each of the separate polynomial equations representations satisfies the accuracy criteria; and determining the piecewise polynomial equation representation based upon the determined separate polynomial equation representations.

2. The method as recited in claim 1, wherein the least squares algorithm is solved using a QR transformation.

3. The method as recited in claim 2, wherein the QR transform is implemented using Householder transforms.

4. The method as recited in claim 1, wherein the specified accuracy criteria specifies a maximum relative error between data contained in the integrated circuit device characterization data and data generated by the polynomial equation representation.

5. The method as recited in claim 1, wherein the integrated circuit device characterization data is generated by performing a simulation of the integrated circuit device.

6. The method as recited in claim 1, wherein the integrated circuit device characterization data is a multi-dimensional lookup table.

7. A computer-readable medium carrying one or more sequences of one or more instructions for representing one or more characteristics of an integrated circuit device, the one or more sequences of one or more instructions which, when executed by one or more processors, cause the one or more processors to perform the steps of:

receiving integrated circuit device characterization data that indicates one or more characteristics of the integrated circuit device;

determining a polynomial equation representation of the integrated circuit device characterization data using a least squares algorithm;

determining whether the polynomial equation representation satisfies a specified accuracy criteria;

determining whether a next higher order polynomial equation representation exceeds a maximum allowable order, when the polynomial equation representation does not satisfy the specified accuracy criteria; and determining a piecewise polynomial equation representation, based upon the integrated circuit device characterization data, that satisfies the specified accuracy criteria, when the maximum allowable order is exceeded, wherein determining a piecewise polynomial equation representation comprises:

determining rates of change of data values contained in the integrated circuit device characterization data;

logically partitioning the integrated circuit device characterization data into two or more portions based upon the determined rates of change of data values;

determining, for each of the two or more portions, a separate polynomial equation representation of the integrated circuit characterization data contained in the respective portion, wherein each of the separate polynomial equations representations satisfies the accuracy criteria; and determining the piecewise polynomial equation representation based upon the determined separate polynomial equation representations.

8. The computer-readable medium as recited in claim 7, wherein the least squares algorithm is solved using a QR transformation.

9. The computer-readable medium as recited in claim 8, wherein the QR transform is implemented using Householder transforms.

10. The computer-readable medium as recited in claim 7, wherein the specified accuracy criteria specifies a maximum relative error between data contained in the integrated circuit device characterization data and data generated by the polynomial equation representation.

11. The computer-readable medium as recited in claim 7, wherein the integrated circuit device characterization data is generated by performing a simulation of the integrated circuit device.

12. A computer data signal embodied in a carrier wave and representing one or more sequences of one or more instructions for representing one or more characteristics of an integrated circuit device, the one or more sequences of one or more instructions which, when executed by one or more processors, cause the one or more processors to perform the steps of:

receiving integrated circuit device characterization data that indicates one or more characteristics of the integrated circuit device;

determining a polynomial equation representation of the integrated circuit device characterization data using a least squares algorithm;

determining whether the polynomial equation representation satisfies a specified accuracy criteria;

determining whether a next higher order polynomial equation representation exceeds a maximum allowable order, when the polynomial equation representation does not satisfy the specified accuracy criteria; and determining a piecewise polynomial equation representation, based upon the integrated circuit device characterization data, that satisfies the specified accuracy criteria, when the maximum allowable order is exceeded, wherein the step of determining a piecewise polynomial equation representation comprises:

determining rates of change of data values contained in the integrated circuit device characterization data;

logically partitioning the integrated circuit device characterization data into two or more portions based upon the determined rates of change of data values;

determining, for each of the two or more portions, a separate polynomial equation representation of the integrated circuit characterization data contained in the respective portion, wherein each of the separate polynomial equations representations satisfies the accuracy criteria; and determining the piecewise polynomial equation representation based upon the determined separate polynomial equation representations.

13. The computer data signal as recited in claim 12, wherein the least squares algorithm is solved using a QR transformation.

14. The computer data signal as recited in claim 13, wherein the QR transform is implemented using Householder transforms.

15. The computer data signal as recited in claim 12, wherein the specified accuracy criteria specifies a maximum relative error between data contained in the integrated circuit device characterization data and data generated by the polynomial equation representation.

16. The computer data signal as recited in claim 12, wherein the integrated circuit device characterization data is generated by performing a simulation of the integrated circuit device.

17. A computer system for representing one or more characteristics of an integrated circuit device, the computer system comprising:

one or more processors; and a memory communicatively coupled to the one or more processors, the memory containing one or more sequences of one or more instructions which, when executed by the one or more processors, cause the one or more processors to perform the steps of:

receiving integrated circuit device characterization data that indicates one or more characteristics of the integrated circuit device;

determining a polynomial equation representation of the integrated circuit device characterization data using a least squares algorithm;

determining whether the polynomial equation representation satisfies a specified accuracy criteria;

determining whether a next higher order polynomial equation representation exceeds a maximum allowable order, when the polynomial equation representation does not satisfy the specified accuracy criteria; and determining a piecewise polynomial equation representation, based upon the integrated circuit device characterization data, that satisfies the specified accuracy criteria, when the maximum allowable order is exceeded, wherein the step of determining a piecewise polynomial equation representation comprises:
  determining rates of change of data values contained in the integrated circuit device characterization data;
  logically partitioning the integrated circuit device characterization data into two or more portions based upon the determined rates of change of data values;
  determining, for each of the two or more portions, a separate polynomial equation representation of the integrated circuit characterization data contained in the respective portion, wherein each of the separate polynomial equations representations satisfies the accuracy criteria; and
  determining the piecewise polynomial equation representation based upon the determined separate polynomial equation representations.

18. The computer system as recited in claim 17, wherein the least squares algorithm is solved using a QR transformation.

19. The computer system as recited in claim 18, wherein the QR transform is implemented using Householder transforms.

20. The computer system as recited in claim 17, wherein the specified accuracy criteria specifies a maximum relative error between data contained in the integrated circuit device characterization data and data generated by the polynomial equation representation.

21. The computer system as recited in claim 17, wherein the integrated circuit device characterization data is generated by performing a simulation of the integrated circuit device.

22. A method for representing one or more characteristics of an integrated circuit device comprising:
  receiving integrated circuit device characterization data that indicates one or more characteristics of the integrated circuit device; and
  successively determining polynomial equation representations, based upon the integrated circuit device characterization data, of increasingly higher-order, until a polynomial equation representation that satisfies a specified accuracy criteria is determined;
  determining whether a next higher order polynomial equation representation exceeds a maximum specified allowable order, when the present polynomial equation representation does not satisfy the specified accuracy criteria; and
  determining a piecewise polynomial equation representation, based upon the integrated circuit device characterization data that satisfies a specified accuracy criteria, when the maximum allowable order is exceeded, wherein determining a piecewise polynomial equation representation comprises:
    determining rates of change of data values contained in the integrated circuit device characterization data;
    logically partitioning the integrated circuit device characterization data into two or more portions based upon the determined rates of change of data values;
    determining, for each of the two or more portions, a separate polynomial equation representation of the integrated circuit characterization data contained in the respective portion, wherein each of the separate polynomial equations representations satisfies the accuracy criteria; and
    determining the piecewise polynomial equation representation based upon the determined separate polynomial equation representations.

23. The method as recited in claim 22, wherein determining a polynomial equation representation is performed using a least squares algorithm.

24. The method as recited in claim 23, wherein the least squares algorithm is solved using a QR transformation.

25. The method as recited in claim 24, wherein the QR transformation is implemented using householder transforms.

26. The method as recited in claim 22, wherein the specified accuracy criteria specifies a maximum relative error between data contained in the integrated circuit device characterization data and data generated by the polynomial equation representation.

27. The method as recited in claim 22, wherein the integrated circuit device characterization data is generated by performing a simulation of the integrated circuit device.

28. The method as recited in claim 22, wherein the integrated circuit device characterization data is a multi-dimensional lookup table.

29. A computer-readable medium carrying one or more sequences of one or more instructions for representing one or more characteristics of an integrated circuit device, the one or more sequences of one or more instructions including instructions which, when executed by one or more processors, cause the one or more processors to perform the steps comprising:
  receiving integrated circuit device characterization data that indicates one or more characteristics of the integrated circuit device; and
  successively determining polynomial equation representations, based upon the integrated circuit device characterization data, of increasingly higher-order, until a polynomial equation representation that satisfies a specified accuracy criteria is determined;
  determining whether a next higher order polynomial equation representation exceeds a maximum specified allowable order, when the present polynomial equation representation does not satisfy the specified accuracy criteria; and
  determining a piecewise polynomial equation representation, based upon the integrated circuit device characterization data that satisfies a specified accuracy criteria, when the maximum allowable order is exceeded, wherein determining a piecewise polynomial equation representation comprises:
    determining rates of change of data values contained in the integrated circuit device characterization data;
    logically partitioning the integrated circuit device characterization data into two or more portions based upon the determined rates of change of data values;
    determining, for each of the two or more portions, a separate polynomial equation representation of the integrated circuit characterization data contained in the respective portion, wherein each of the separate polynomial equations representations satisfies the accuracy criteria; and
    determining the piecewise polynomial equation representation based upon the determined separate polynomial equation representations.

30. The computer-readable medium as recited in claim 29, wherein determining a polynomial equation representation is performed using a least squares algorithm.

31. The computer-readable medium as recited in claim 30, wherein the least squares algorithm is solved using a QR transformation.

32. The computer-readable medium as recited in claim 31, wherein the QR transformation is implemented using householder transforms.

33. The computer-readable medium as recited in claim 29, wherein the specified accuracy criteria specifies a maximum relative error between data contained in the integrated circuit device characterization data and data generated by the polynomial equation representation.

34. The computer-readable medium as recited in claim 29, wherein the integrated circuit device characterization data is generated by performing a simulation of the integrated circuit device.

35. The computer-readable medium as recited in claim 29, wherein the integrated circuit device characterization data is a multi-dimensional lookup table.

* * * * *